United States Patent [19]

Yamada et al.

[11] Patent Number: 5,356,753
[45] Date of Patent: Oct. 18, 1994

[54] POSITIVE RESIST MATERIAL

[75] Inventors: Motoyuki Yamada, Saitama; Osamu Watanabe, Niigata; Akinobu Tanaka, Kanagawa; Hiroshi Ban, Kanagawa; Yoshio Kawai, Kanagawa, all of Japan

[73] Assignees: Shin-Etsu Chemical Co., Ltd.; Nippon Telegraph and Telephone Corp., both of Tokyo, Japan

[21] Appl. No.: 973,398

[22] Filed: Nov. 12, 1992

[30] Foreign Application Priority Data

Nov. 11, 1991 [JP] Japan ................. 3-321540

[51] Int. Cl.$^5$ ............................. G03C 1/492
[52] U.S. Cl. .................... 430/270; 430/326; 430/905; 430/914; 430/925; 430/921
[58] Field of Search ............... 430/270, 326, 909, 914, 430/917, 925, 905, 921; 522/31

[56] References Cited

U.S. PATENT DOCUMENTS

| 5,035,979 | 7/1991 | Nguyen-Kim et al. | 430/270 |
| 5,204,216 | 4/1993 | Kim | 430/270 |

FOREIGN PATENT DOCUMENTS

| 0102450 | 3/1984 | European Pat. Off. | |
| 0249139 | 12/1987 | European Pat. Off. | |
| 0388813 | 9/1990 | European Pat. Off. | 430/270 |
| 0443415 | 8/1991 | European Pat. Off. | |

OTHER PUBLICATIONS

L. Schlegel et al, "Determination of acid diffusion in chemical amplification positive deep ultraviolet resists", *Journal of Vacuum Science and Technology: Part B*, vol. 9, No. 2 (Apr. 1991), pp. 278–289.

A. A. Lamola et al, "Chemically amplified resists", *Solid State Technology*, vol. 34, No. 8 (Aug. 1991), pp. 53–60.

Primary Examiner—Janis Dote
Attorney, Agent, or Firm—Millen, White, Zelano & Branigan

[57] ABSTRACT

A positive resists material for high energy-sensitive positive resists which can be developed in aqueous alkali solution, said material comprising (A) a polyhydroxystyrene resin wherein some hydroxyl groups are substituted by t-butoxycarbonyloxy groups, (B) a solution blocking agent, and (C) an onium salt, and being characterized in that said solution blocking agent contains at least one t-butoxycarbonyloxy group per molecule, said onium salt is bis(p-t-butylphenyl) iodinium trifluormethylsulfonate represented by the following formula (1):

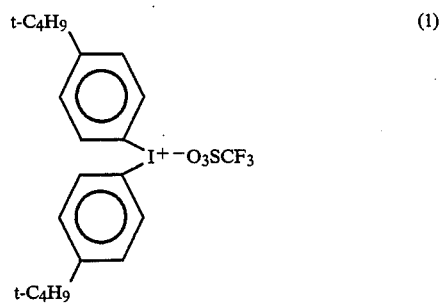

and the weight proportions of (A), (B), (C) are given by the relations: $0.07 \leq B \leq 0.40$, $0.005 \leq C \leq 0.15$, $0.55 \leq A$, $A+B+C=1$. As the resist has low absorption at the exposure wavelength of a KrF exima laser, a fine pattern having vertical walls is easily formed.

5 Claims, 3 Drawing Sheets

POSITIVE RESIST MATERIAL

FIELD OF THE INVENTION

This invention relates to a positive resist material having high sensitivity to high energy radiations such as far ultraviolet (UV) light, electron beams and X-rays, which forms patterns by developing in an aqueous alkali solution, and which is suitable for fine patterning.

BACKGROUND OF THE INVENTION

As large scale integrated circuits (LSI) become more complex and achieve higher operating speeds, a demand for finer pattern rules is emerging. Using ordinary photoexposure procedures, however, practical limits of resolution defined by the wavelength of the light source used are rapidly being approached. By photoexposure to g rays (436 nm) or i rays (365 nm) as the light source, for example, this limit is a pattern rule of approximately 0.5 μm permitting manufacture of an LSI corresponding to a degree of integration required by a 16M bit DRAM. LSI prototypes have however already reached this stage, and there is thus an urgent need to develop still finer patterning methods.

In this context, far UV lithography appears to offer promise as a new patterning technique. This type of lithography permits patterning down to 0.3 to 0.4 μm, and a pattern having effectively vertical walls with respect to the substrate can be obtained if a resist having a low light absorption is used. Moreover, as this technique makes it possible to transfer a pattern in one operation, it offers a higher throughput than electron beam lithography. High intensity KrF exima lasers are now being used as light sources for far UV radiation, but if they are to have practical utility in mass production techniques, a highly sensitive resist with low light absorption is required.

Recently, resists which are capable of chemical amplification with an acid as a catalyst (such as that proposed by Liu et al in J. Vac. Sci. Technol., Vol. B6, p 379 (1988)) have been shown to possess excellent properties such as sensitivity similar to or greater than conventional resists, high resolution and good tolerance to dry etching, and they are therefore regarded as being particularly promising insofar as concerns far UV lithography. Shipley Inc. is already marketing a negative resist that uses chemical amplification (SAL601ER7) consisting of three components, i.e. novolak resin, a melamine compound and an acid-producing agent, but a positive type resist using chemical amplification was not commercially available. However, although negative resists can be used for some LSI manufacturing processes such as wiring or gate forming, fogging tends to occur when they are used to form contact holes. Fine patterning is difficult, and positive resists are far more suitable for this purpose.

A high performance positive resist is, therefore, strongly desired. Ito et al have developed such a positive type resist that uses chemical amplification by adding an onium salt to a resin known as PBOCST wherein the OH groups of polyhydroxystyrene are protected by t-butoxycarbonyl groups (hereinafter, abbreviated as tBoc groups).

The onium salt used contains antimony as a metal component (Polymers in Electronics, ACS Symposium Series. No. 242 (American Chemical Society, Washington D.C., 1984),p. 11). In order to avoid contaminating the substrate, metal components in the resist material are generally undesirable, and the aforesaid PBOCST resist is therefore unsuitable from the process viewpoint. Ueno et al report a far UB positive resist having p-styreneoxy tetrahydropyranyl as the principal component to which an acid-producing agent is added (36th Oyoo Butsuri Gakkai Kanren Rengo Koenkai, 1980, 1p-k-7).

The inventors however found that this type of resist tended to undergo positive to negative inversion when exposed to far UV radiation, electron beams or X-rays. With a two-component positive resist system consisting of a resin wherein the OH groups are protected by protecting groups combined with an acid-producing agent, many protecting groups have to be decomposed so that the resist can dissolve in the developing solution, and there is a considerably high risk of film thickness variations, in-file stress or air bubbles.

However, using a three component system with more diversified functions as a positive resist which makes use of chemical amplification, i.e. an alkali-soluble resin, a solution blocking agent and an acid-producing agent, not such acid is required to decompose the solution blocking agent. This suggests the possibility of reducing the aforesaid film thickness variations and generation of air bubbles so that the resist is more useful for very fine patterning applications. Hechist Inc. has developed a resist for X-ray lithograph, RAY/PF, wherein an acetal compound as a solution blocking agent is added to novolak resin, and an acid-producing agent is then added.

RAY/PF undergoes chemical amplification at room temperature. and its resist sensitivity closely depends on the time for which it is left after exposure to X-rays. In actual practice, strict regulation of the time between the exposure and developing processes is not easy. It might therefore be inferred that using this material, it is difficult to control pattern dimensioning. Further, its light absorption at the exposure wavelength of a KrF exima laser (248 nm) is too high.

In general, in order to make use of chemical amplification, many resists required post-exposure backing (PEB). Compared to resist systems where the system is merely left at room temperature to undergo chemical amplification, an additional resist process is involved, but as it is not necessary to regulate the time between exposure and developing so strictly, it is easier to control the properties of the resist.

In systems where hydrolysis occurs in the chemical amplification process, water is required for the hydrolysis reaction, and the resist must therefore contain a large amount of water.

In general, an organic solvent which is immiscible with water such as thoxyethyl acetate is used as a coating solvent for the resist material, and in many resist materials, the resin itself is not very compatible with water. It is also difficult to blend a predetermined amount of water with these resist systems, and even if the blending can be achieved, the number of components that must be controlled is larger which renders the system more complex. The decomposition of tBoc groups, however, proceeds with only two components, i.e. the tBoc group and an acid catalyst. As water is not required as a third component, the reaction is simpler and is well suited to chemical amplification.

It is known that the tBoc derivatives of many compounds block the dissolution of novolak resin, and that the tBoc group is useful for conferring insolubility.

Schlegel et al reported a three component positive resist comprising novolak resin, a solution blocking agent consisting of the tBoc derivative of bisphenol A, and pyrogallol methanesulfonic acid ester (37th Oyoo Butsuri Gakkai Kanren Rengo Koenkai, Spring 1990, 28p-ZE-4).

Schwalm et al developed a bis (p-t-butoxycarbonyloxy-phenyl) iodinium hexafluoroantimonate as a combined solution blocking agent and acid-producing agent. (Polymer for Microelectronics, Tokyo 1989, Session A38) which, when mixed with novolak resin, is used as a positive resist with far UV light. However, as this system contains a metal, and as the light absorption of the novolak resin is too high, it is not suitable for practical application.

Moreover, if patterning was performed on conventional positive resists that undergo chemical amplification by means of far UV light, electron beams or X rays, the pattern tended to suffer from overhang.

This is assumed to be due to the fact that the solubility of the resist surface decreases (K. G. Chiong et al, J. Vac. Sci. Technol., Vol. B7, (6), p. 1771, (1989)). Overhang makes pattern dimension control difficult and impairs dimensional controllability even when substrates are patterned by dry etching.

Further, the base of the pattern was etched too fine, and easily led to pattern collapse.

As described hereintofore, many positive resists capable of chemical amplification which have a novolak or polyhydroxystyrene base resin and are sensitive to far UV radiation, electron beams or X rays, have been reported in the art. All of them are however associated with problems, and it is still difficult to use them in practical applications.

SUMMARY OF THE INVENTION

Figure 1:
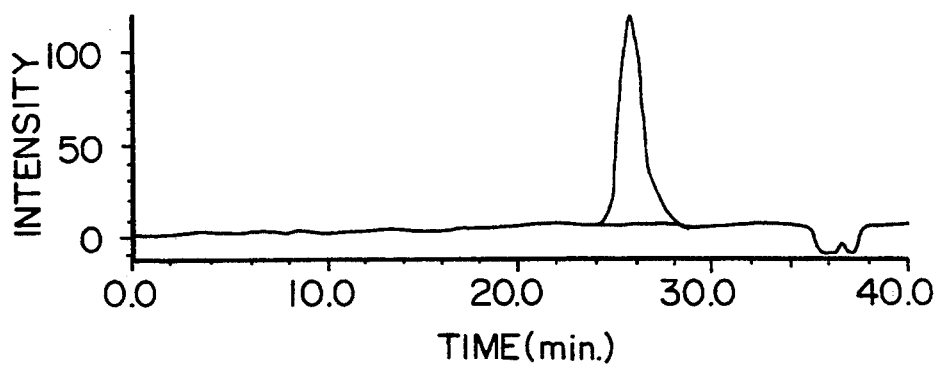
FIG. 1 shows the GPC elution curve of poly(p-vinylphenoxydimethylphenylcarbyldimethylsilane).

An object of this invention is to provide a positive resist material suitable for exposure to high energy radiation which is technically superior to conventional resists, and which has excellent sensitivity, resolution and process applicability.

This invention is a high energy-sensitive positive resist which can be developed in aqueous alkali solution comprising (A) a polyhydroxystyrene resin wherein some hydroxyl groups have been substituted by t-butoxycarbonyloxy groups, (B) a solution blocking agent, and (C) an onium salt, and characterized in that said solution blocking agent contains at least one t-butoxycarbonyloxy group per molecule, said onium salt is a bis (p-t-butylphenyl) iodinium trifluoromethylsulfonate represented by the following formula (1):

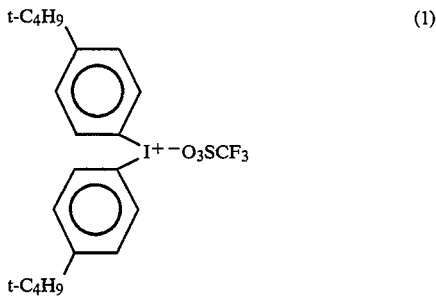

and the weight proportions of (A), (B), (C) are given by the relations: $0.07 \leq B \leq 0.40$, $0.005 \leq C \leq 0.15$, $0.55 \leq A$, $A+B+C=1$.

As the resist has low absorption at the exposure wavelength of a KrF exima laser, a fine pattern having vertical walls is easily formed.

DETAILED DESCRIPTION OF THE INVENTION

Other trifluoromethylsulfonate onium salts which are known in addition to the compound represented by the following formula (1), which is used in the present invention.

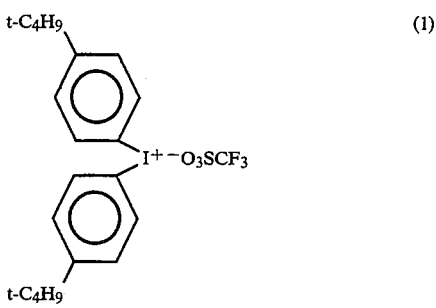

are the compounds represented by the following formulae (2), (3) and (4):

(2): $(C_6H_5)_2 I^+ {}^-O_3SCF_3$
(3): $(C_6H_5)_3 S^+ {}^-O_3SCF_3$
(4): $(C_6H_5 S C_6H_4)(C_6H_5)_2 S^+ {}^-O_3SCF_3$

However, as composed (2) has low solubility in solvents suitable for coating the resist, such as ethyl cellosolve acetate, ethyl lactate and methoxy-2-propanol, a suitable amount of compound (2) cannot be blended with the resist. The solubility of compound (3) is relatively good. However, if a three component resist is manufactured using this compound, although film thinning occurred in developing after an exposure of 1 to 4 $\mu C/cm^2$ regardless of the type of solution blocking agent, the resist inverted to the negative type before the exposed area completely dissolved, and a positive resist could not be obtained. This kind of negative inversion has also been reported by Schlegel et al (see aforesaid Reference), and it was so far generally accepted that onium salts of trifluoromethyl-sulfonate systems could not be applied to three component positive resists containing tBoc type solution blocking agents. Compound (4) is an oil at ordinary temperature, so it is difficult to purify it, and the properties of resist materials using it as an acid-producing agent tend to vary from batch to batch.

The onium salts which are the most useful as acid-producing agents for resists that undergo chemical amplification, are aromatic sulfonium salts (37th Oyoo Butsuri Gakkai Kanren Rengo Koenkai, 1990, 28p-PD-2). However, as described hereintofore, sulfonium salts of trifluoromethylsulfonic acid can not be used practically as acid-producing agents for three component positive resists having a tBoc compound as a solution blocking agent (hereinafter, abbreviated as tBoc solution blocking agent).

The inventors carried out intensive studies to find an acid-producing agent which is an organic onium salt, has high solubility in resist coating solvents, and exhibits satisfactory positive resist properties when used in combination with a polyhydroxystyrene type resin and a tBoc solution blocking agent is a three component positive resist material. As a result, it was found that bis (p-t-butylphenyl) iodonium trifluoromethylsulfonate represented by formula (1) conformed to these requirements.

The compound (1) is crystalline, can be purified by recrystallization, and has good solubility in resist coating solvents as typified by ethoxyethyl acetate. Further, when electron beam tracing was performed at an applied voltage of 30 kV on three component resists comprising compound (1), a polyhydroxystyrene type resin and a tBoc solution blocking agent, compound (1) acted as a satisfactory acid-producing agent with respect to many tBoc solution blocking agents, its $D_e$ sensitivity was of the order of 3 to 20 $\mu C/cm^2$ and positive-negative inversion did not occur at least up to 72 $\mu C/cm^2$.

The proportion of compound (1) in the resist of this invention preferably lies in the range 0.5 to 15 wt %. If this proportion is less than 0.5%, the resist still shows positive type properties but its sensitivity is low. When the proportion of acid-producing agent is increased, the resist tends to show higher sensitivity and the contrast ($\tau$) improves. If this proportion is greater than 15%, the resist still shows positive type properties. However, as no further increase of sensitivity can be expected for higher proportions, as compound (1) is costly, and as the increase in low molecular weight components of the resist lowers the mechanical strength of the resist film, the proportion of compound (1) is preferably no greater than 15%.

A resist material according to this invention using compound (1) must contain at least one t-butoxycarbonyloxy (hereinafter, abbreviated as tBoc-O-) group per molecule as a solution blocking agent. The proportion of the solution blocking agent should lie in the range 7 to 40wt %. If it is less than 7 wt % the solution blocking effect is small, and if it is greater than 40 wt %, the mechanical strength and heat resistance of the resist decline.

Conventionally, a material wherein OH groups of bisphenol A were substituted by tboc-O- was practically the only tboc compound that had been reported as a positive resist solution blocking agent.

Intensive studies per formed by the inventors however revealed that a tboc-O- derivative of phloroglucinol or tetrahydroxybenzophenone could also be used as a solution blocking agent.

If novolak resin is used as the base resin, the resist absorbs KrF laser light too strongly. We therefore used polyhydroxystyrene which has a small absorption, however, the solution blocking effect when the solution blocking agent was added, was also small. This is due to the high solubility of polyhydroxystyrene, so to suppress it, some of the hydroxyl groups were substituted by tBoc-O- groups.

A solution blocking effect of more than 10 times was then obtained. The degree of substitution by tBoc-O- preferably lies in the range 10 to 50 mol %. If it is greater than 50 mol %, the solubility in aqueous alkali solution decreases, and sensitivity in ordinary developing solutions sharply declines. If on the other hand the degree of substitution is less than 10 mol %, the solution blocking effect is small.

It is desirable that the weight average molecular weight of the polyhydroxystyrene is no less than 10,000 from the viewpoint of the heat resistance of the resist pattern formed. However, as the molecular weight of polymers formed by radical polymerization has a wide distribution, and due to high molecular weight species which are difficultly soluble in aqueous alkali solution, sloping tends to occur at the base of the pattern after it has been formed. To form a high precision pattern, it is therefore advantageous to use high molecular weights with as narrow a molecular weight distribution as possible. According to this invention, using a polyhydroxystyrene obtained by living polymerization (molecular weight 14,000, molecular weight distribution 1.1), a 0.2 $\mu$m line and space pattern was formed with no sloping at the base and with high precision. Further, as regards heat resistance, the pattern did not deform even when baked at 150° C. for 10 minutes. With a product of molecular weight 12,000 obtained by radical polymerization, the molecular weight distribution was 3.0 and sloping at the base was seen even on a 0.5 $\mu$m line and space pattern.

Polymers giving a narrow molecular weight distribution may generally be obtained either by fractionating a product of wide molecular weight distribution from radical polymerization or another technique into products of different degrees of polymerization, or by controlling the molecular weight by means of living polymerization. As the former method is troublesome and leads to decreased yields, however, living polymerization is to be preferred.

If it is attempted to obtain the parahydroxystyrene polymer of this invention by subjecting parahydroxystyrene monomer to living polymerization, the hydroxyl groups of the monomer react with one polymerization initiator with the result that polymerization does not occur. A monomer wherein the hydroxyl groups are protected by protecting groups is therefore subjected to living polymerization, and these protecting groups are removed after polymerization so as to obtain the desired parahydroxypolystyrene polymer. Examples of such protecting groups are tertiary buty, dimethyl-phenyl-carbylmethylsilyl, tBoc, tetrahydropyranyl and tertiary butyldimethylsilyl.

More specifically, the polyhydroxystyrene of narrow dispersion which is the base resin of the resist material of this invention may for example be obtained by living polymerization of a monomer having the following structural formulae (5) or (6):

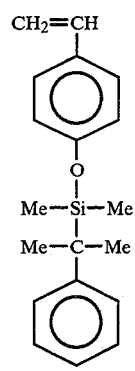 (5)

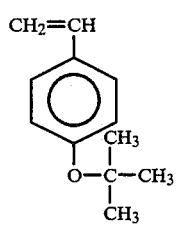 (6)

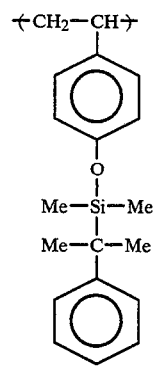 (7)

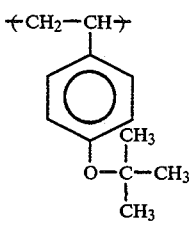 (8)

After polymerization, in the case of structural formula (5) the dimethylphenylcarbylsilyl group is removed, and in the case of formula (6) the t-butyl group is removed. The living polymerization of the aforesaid monomer is initiated by an initiator which is an organometallic compound. Examples of such initiators are organic alkali metal compounds such as n-butyl lithium, sec-butyl lithium, t-butyl lithium, sodium naphthalene, sodium anthracene, disodium α-methylstyrene tetramer, cumyl potassium and cumyl cesium.

The living polymerization of the aforesaid monomers is generally performed in an organic solvent. This organic solvent may be an aromatic hydrocarbon, cyclic ether or aliphatic hydrocarbon, specific examples being benzene, toluene, tetrahydrofuran, dioxane, tetrahydropyrane, dimethoxyethane, n-hexane and cyclohexane. These organic solvents may be used alone, or two or more may be used in combination.

The concentration of monomer in the polymerization reaction preferably lies in the range 1 to 50 wt %, and more preferably in the range 1 to 30 wt %. The reaction is performed with stirring under high vacuum, or in an inert gas such as argon or nitrogen. The reaction temperature can be chosen freely in a range extending from −100° C. to the boiling point of the organic solvent, however for tetrahydrofuran it is preferably −78° C. to 0° C. and for benzene it is preferably room temperature.

Normally, in a reaction time of from approximately 10 minutes to 7 hours, only vinyl groups polymerize. The structural formula (5) gives a polymer represented by the structural formula (7), and the structural formula (6) gives a polymer represented by the structural formula (8).

The reaction is terminated by adding a terminator such as methanol, water or methyl bromide to the reaction system. The polymer is purified by first precipitating it from the reaction solution obtained with a suitable solvent, for example methanol, and then washing, drying and separating it. The resulting polymer compound is a monodispersion in terms of its molecular weight distribution ($1.00 < Mw/Mn \leq 1.50$).

The yield of polymer is effectively 100% based on the amount of monomer used in the reaction, and its molecular weight can easily be calculated from the weight of monomer and the mole number (molecular number) of the polymerization initiator. The number average molecular weight (Mn) can be found by measurement with a membrane osmometer, and the molecular weight distribution can be evaluated by Gel Permeation Chromatography (GPC). It is thus possible to determine whether or not the polymer obtained is the desired polymer.

The dimethylphenylcarbyldimethylsilyl groups are removed from the structural formula (7), or the t-butyl groups removed from the structural formula (8) so as to obtain polyhydroxystyrene having the phenol residue structural unit represented by the following structural formula (9):

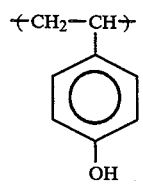

The ether bond can easily be cleaved by dripping in an acid such as hydrochloric acid or hydrobromic acid in a mixed solvent containing dioxane, acetone, acetonitrile or benzene. In these reactions, the main chain of the polymer is not cleaved and intermolecular cross-linking reactions do not occur, so a monodispersed polyhydroxystyrene having a narrow molecular weight distribution can easily be obtained.

t-Boc-O- substitution of the OH group is a method of protecting functional groups in a compound which is often used in peptide synthesis, and it can be simply performed by reacting the compound with di-t-butyl bicarbonic acid in pyridine solution.

A pattern using the resist of this invention can be formed as will now be described. A solution of the resist is spin-coated on a substrate, prebaked, and exposed to high energy radiation. This causes the acid-producing agent to decompose and produce acid. When PEB is performed, the acid acts as a catalyst in the decomposition of the tBoc groups, and the solution blocking effect is thereby nullified. The resist can then be developed in an aqueous alkali solution, and rinsed with water so as to obtain a positive resist pattern.

An example of synthesizing the starting materials used in this invention will now be given, but the invention is not to be construed as being limited to this example.

Synthesis Example 1: Synthesis of Polyhydroxystyrene with a Narrow Dispersion p-vinylphenol was introduced in a reaction vessel together with its molar equivalent of dimethylphenylcarbyl-dimethylfluorosilane, and the two substances reacted together in dimethylformamide solvent in the presence of imidazole at room temperature for 6 hours the reaction product was distilled at reduced pressure, and p-vinylphenoxydimethylphenylcarbyl-dimethylsilane was obtained in 70% yield. This p-vinylphenoxydimethylphenylcarbyl-dimethylsilane had a boiling point of 130° C. at 0.1 mm Hg.

In order to remove water and other impurities from the aforesaid monomer, it was purified with $CaH_2$ and sodium benzophenonate, and distilled.

To carry out the polymerization, 550 ml tetrahydrofuran as solvent and $8.5 \times 10^{-4}$ mol of n-butyl lithium as polymerization initiator were introduced in a 1 liter flask. 30 g p-vinylphenoxydimethylphenylcarvinyldimethylsilane diluted with 50 ml tetrahydrofuran was then added to this mixture at $-78°$ C. After carrying out the polymerization for 1 hours, the solution had a red color. Methanol was added to the reaction solution to terminate the polymerization. The reaction mixture was then poured into methanol to precipitate the polymer, after which it was separated and dried so as to obtain 24.5 g of a white substance. The $^1$H-NMr spectrum of this product was measured and found to be as shown in the following Table 1.

TABLE 1

| $^1$H-NMR | | |
|---|---|---|
| 0.0 ppm: | Standard | (S, 6H, O—Si—CH$_3$) |
| 1~2 ppm: | | (broad, 6H, Si—C—CH$_3$) |
| 1~2 ppm: | | (broad, 3H, CH$_2$, —CH) |
| 6~7 ppm: | | (broad, 5H, Si—C—C$_6$H$_5$) |
| 6~7 ppm: | | (broad, 4H, C$_6$H$_5$) |

The GPC elution curve was as shown in FIG. 1. FIG. 1 shows the relation between time (min., horizontal axis) and intensity (vertical axis). From the $^1$H-NMR spectrum, it was confirmed that unreacted active terminals remained on the dimethylphenyl-carbyldimethylsilyl groups bonded to ether, and that only the vinyl groups on the styrene part of the molecule had reacted.

Figure 2:
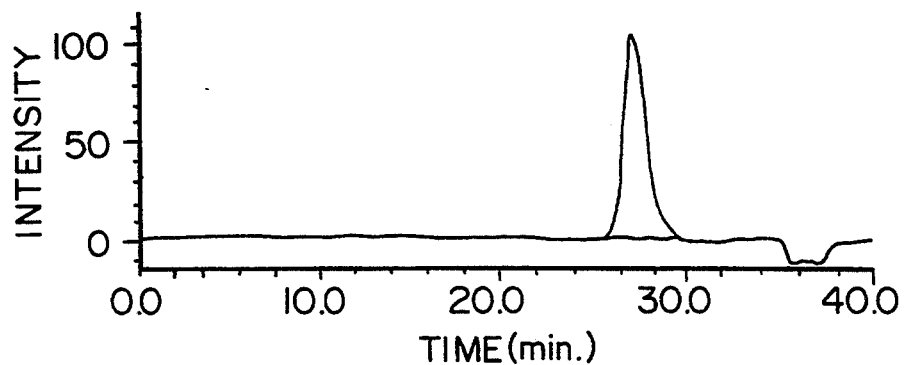
FIG. 2 shows the GPC elution curve of narrow dispersion polyhydroxystyrene.

Next, 20 g of the poly(p-vinylphenoxydimethylphenyl-carbyldimethylsilane) obtained as described hereinabove was dissolved in 250 ml acetone, a small amount of concentrated hydrochloric acid added at 60° C., the mixture stirred for 6 hours, and the product poured into water giving a precipitate which was washed and dried so as to obtain 8 g of polymer. The number average molecular weight of the polymer obtained was $1.4 \times 10^{-4}$ g/mol. As seen from FIG. 2, the GPC elution curve shows that this polymer had a very marked monodispersed character, and that its molecular weight distribution was 1.10.

The $^1$H-NMR spectrum showed no peaks due to the dimethylphenylcarbyldimethylsilane group, thus confirming that the polymer obtained was polyhydroxystyrene with a narrow molecular weight distribution.

Synthesis Example 2: Synthesis of Polyhydroxystyrene with a Narrow Dispersion p-t-butoxystyrene monomer starting material was dehydrated and purified in the same way as described in Example 1. To carry out the polymerization, 1500 ml tetrahydrofuran as solvent and $4 \times 10^{-3}$ mol of n-butyl lithium initiator were introduced in a 2 liter flask. 80 g of p-t-butoxystyrene diluted with 50 ml tetrahydrofuran was then added to the mixture at $-78°$ C. After carrying out the polymerization for 2 hours, this solution had a red color. After confirming that the desired polymerization had occurred, methanol was added to the reaction solution to terminate the polymerization reaction. The reaction mixture was then poured into methanol to precipitate the polymer, after which it was separated and dried so as to obtain 80 g of a white substance.

Figure 3:
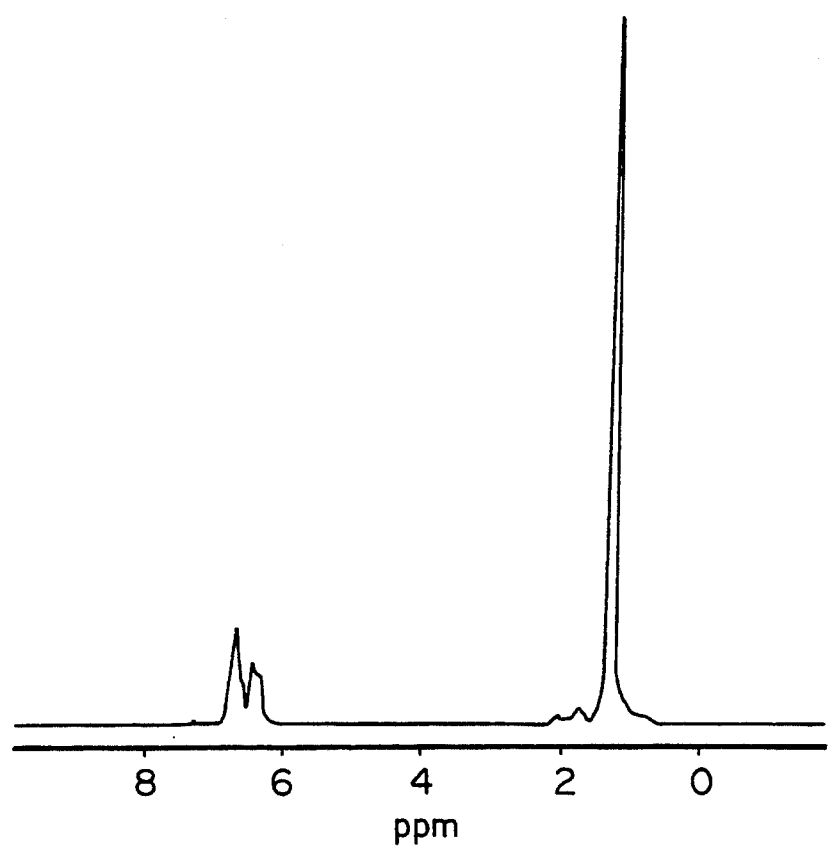
FIG. 3 shows the $^1$H-NMR chart of poly(p-t-butoxystyrene).
Figure 4:
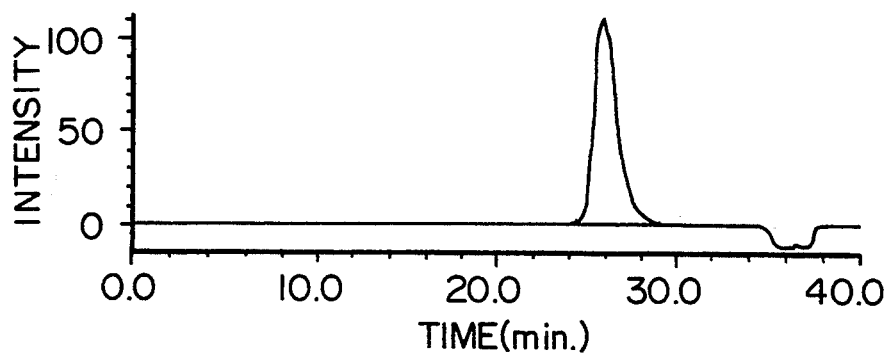
FIG. 4 shows the GPC elution curve of poly(p-t-butoxystyrene).

The $^1$H-NMR spectrum of this product was measured and found to be as shown in FIG. 3 (ppm on horizontal axis), while the GPC elution curve was as shown in FIG. 4.

From the $^1$H-NMR spectrum, it was confirmed that unreacted active terminals remained on the t-butyl groups bonded to ether, and that only the vinyl groups on the styrene part of the molecule had reacted.

Figure 5:
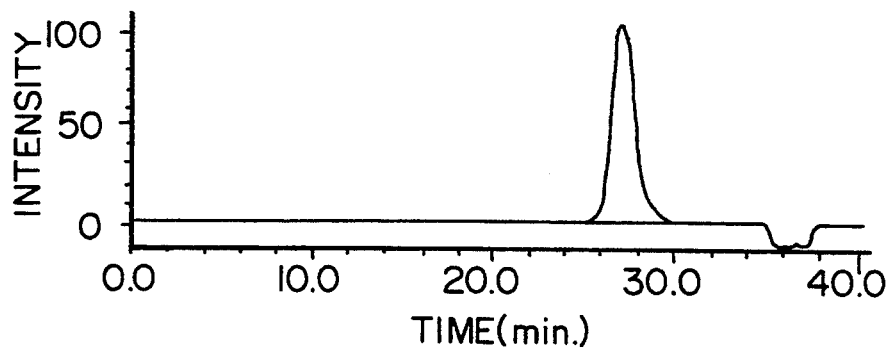
FIG. 5 shows the GPC elution curve of another narrow dispersion polyhydroxystyrene.

Next, 12 g of the poly(p-t-butoxystyrene) obtained as described hereintofore was dissolved in 250 ml acetone, a small amount of concentrated hydrochloric acid added at 60° C., the mixture stirred for 6 hours, and the product poured into water giving a precipitate which was washed and dried so as to obtain 8 g of polymer. The number average molecular weight of the polymer obtained was $1.4 \times 10^{-4}$ g/mol. The GPC elution curve is as shown in FIG. 5, and confirms that this polymer had a very marked monodispersed character. Its molecular weight distribution was 1.08.

The $^1$H-NMR spectrum showed no peaks due to the t-butyl group, thus confirming that the polymer obtained was polyhydroxystyrene with a narrow molecular weight distribution.

Synthesis Example 3: tBoc-O- Substitution of Polyhydroxystyrene 5 g of polyhydroxystyrene obtained by the living polymerization of Synthesis Example 1 was dissolved in 40 ml of pyridine, and 1 g of di-t-butyl bicarbonic acid- (approx 20 mol %) was added at 45° C. with stirring. As the addition is made gas is evolved, and the reaction is carried out in a current of $N_2$ for 1 hours. The reaction solution was dripped into 1 liter of water containing 20 g concentrated hydrochloric acid so as to obtain a white precipitate.

After filtration, the precipitate was dissolved in 50 ml of acetone, and the resulting solution was dripped into 1 liter of water. After filtering off the precipitate, it was dried in vacuo at a temperature not exceeding 40° C. From the 8 ppm OH peak on the $^1$H-NMR spectrum, the degree of substitution by tBoc-O- was found to be 19.6%.

ADVANTAGES OF THE INVENTION

The positive resist obtained in this invention is sensitive to high energy radiation, and it has excellent sensitivity, resolution and resistance to plasma etching. The heat resistance of the resist pattern is also excellent, the pattern does not tend to develop overhang, and controllability of dimensions is excellent. It is superior in that it does not contain metal elements, PEB is required in the chemical amplification process so that resist properties have little time dependence after exposure, and water is not required in the chemical amplification process so the system is simpler. This resist is therefore especially suitably for fine patterning by electron beams or far UV radiation.

EXAMPLES

The invention will now be described in further detail by reference to the following examples, but it will be understood that the invention is not to be construed as being limited by these examples in any way.

In Examples 1 to 22, the resin used as base resin was the polyhydroxystyrene obtained in Synthesis Example 3 wherein the degree of substitution by tBoc-O- was 20 mol %, and in Examples 23 to 32, the same resin was used wherein the degree of substitution by tBoc-O- was 40 mol %. In Examples 33 and 34, the resin used as base resin was the polymer of Synthesis Example 2 substituted by tBoc-O- (degree of substitution by tBoc-O- = 20 mol %). The acid-producing agent was the compound represented by the general formula (1).

EXAMPLE 1

A resist solution comprising the following components:

| Base resin: | 81 parts by weight |
| --- | --- |
| 2,2-bis(p-(tBoc-O-)phenyl)propane: | 14 parts by weight |
| Acid-producing agent (Compound 1): | 5 parts by weight |
| Ethoxyethyl acetate: | 400 parts by weight | was spin-coated onto a silicon substrate at 2000 rpm, and prebaked on a hot plate at 85° C. for 1 minute. The film thickness was 0.7 μm. After patterning with an electron beam having an accelerating voltage of 30 kV, PEB was performed at 85° C. for 3 minutes. Developing was performed in a 2.4% aqueous solution of tetramethylammonium hydroxide (TMAH) for 1 minute, and the product rinsed with water for 30 seconds.

The resulting resist showed positive resist type properties, and its $D_0$ sensitivity was 6 μC/cm$^2$. Its $D_0$ sensitivity evaluated using KrF exima laser light, which is in the far UV range (wavelength 248 nm), was 20 mJ/cm$^2$. If PEB was performed at 85° C. for 5 minutes, its electron beam sensitivity was 4.5 μC/cm$^2$.

The base resin used herein had a dissolution rate of 35 nm/s in the developing solution. The unexposed part of the resist had a dissolution rate of approx. 1.5 nm/s, and after PEB, the exposed part had a dissolution rate of 23 nm/s. When the resist was exposed to a KrF exima laser, a 0.3 μm line and space pattern or hole pattern could be resolved, and a pattern having vertical side walls was formed. When electron beam patterning was used, the resolution achieved was 0.2 μm.

EXAMPLE 2

A resist solution comprising the following components:

| Base resin: | 81 parts by weight |
| --- | --- |
| 1,3,5-tris(tBoc-O-)benzene: | 14 parts by weight |
| Acid-producing agent (Compound 1): | 5 parts by weight |
| Ethoxyethyl acetate: | 400 parts by weight | was prepared and evaluated in the same way as in Example 1. The electron beam sensitivity was 6.6 μC/cm$^2$, and KrF sensitivity was 30 mJ/cm$^2$. Before this resist was exposed, its rate of dissolution in the developing solution was approximately 1 nm/s, which showed that the rate was slowed to 1/35 by the solution blocking agent. It was confirmed that the resist provided the same order of resolution with respect to KrF exposure or electron beam patterning as that of Example 1, and in the case of KrF exposure, a pattern having vertical side walls was formed.

EXAMPLE 3

A resist solution comprising the following components:

| Base resin: | 81 parts by weight |
| --- | --- |
| Poly(p-(tBoc-O-))styrene of molecular weight 2500: | 14 parts by weight |
| Acid-producing agent (Compound 1): | 5 parts by weight |
| Ethoxyethyl acetate: | 400 parts by weight | was prepared and evaluated in the same way as in Example 1.

Developing was performed in 2.8% aqueous TMAH for 1 minute. It was confirmed that the resist showed the characteristics of a positive type resist, and its electron beam sensitivity was 10 μC/cm$^2$. Its KrF radiation sensitivity was 50 mJ/cm$^2$. This resist showed no film thinning whatever under the developing conditions used in Example 1, and the dissolution rate of the unexposed part was less than 0.1 nm/s. This confirmed that the effect of the solution blocking agent of this Example was far greater than that of the agents of Example 1 and 2.

EXAMPLE 4

A resist solution comprising the following components:

| Base resin: | 81 parts by weight |
| --- | --- |
| High molecular weight solution blocking agent obtained by substituting OH groups of novolak resin of molecular weight 2000 by tBoc-O-: | 14 parts by weight |
| Acid-producing agent (Compound 1): | 5 parts by weight |
| Ethoxyethyl acetate: | 400 parts by weight | was prepared and evaluated in the same way as in Example 3. EB was performed at 100° C. for 30 seconds. It was confirmed that the resist showed the properties of a positive type resist, and its electron beam sensitivity was 31 μC/cm$^2$. This resist also showed no film thinning whatever under the developing conditions used in Example 1, and the dissolution rate of the unexposed part was less than 0.1 nm/s. From Examples 3 and 4, it was confirmed that a high molecular weight solution blocking agent has a far greater effect than that of a low molecular weight solution blocking agent.

EXAMPLES 5–12

The electron beam sensitivity of resists prepared from a resist solution comprising 81 parts by weight of a base resin, 14 parts by weight of a solution blocking agent, 5 parts by weight of an acid-producing agent and 400 parts by weight of ethoxyethyl acetate, was evaluated for different solution blocking agents. Tables 2 and 3 show the results.

TABLE 2

| Example | Solution blocking agent ($C_4H_9$ means t-$C_4H_9$) | PEB Condition | $D_o$ ($\mu C/cm^2$) |
|---|---|---|---|
| 5 | Phenyl-OCOC$_4$H$_9$ | 50° C., 1 minute | 40 |
| 6 | 2,6-dinitrophenyl-OCOC$_4$H$_9$ | 85° C., 3 minutes | 22 |
| 7 | H$_9$C$_4$OCO-phenyl-OCOC$_4$H$_9$ (1,4) | 60° C., 3 minutes | 18 |
| 8 | 2-nitro-1,3-bis(OCOC$_4$H$_9$)phenyl | 85° C., 3 minutes | 6.5 |
| 9 | H$_9$C$_4$OCO-phenyl-SO$_2$-phenyl-OCOC$_4$H$_9$ | 85° C., 3 minutes | 5.0 |

TABLE 3

| Example | Solution blocking agent ($C_4H_9$ means t-$C_4H_9$) | PEB Condition | $D_o$ ($\mu C/cm^2$) |
|---|---|---|---|
| 10 | H$_9$C$_4$OCO-phenyl-C(CF$_3$)$_2$-phenyl-OCOC$_4$H$_9$ | 85° C., 3 minutes | 15 |
| 11 | 1,2,3-tris(OCOC$_4$H$_9$)phenyl | 85° C., 3 minutes | 10 |

TABLE 3-continued

| Example | Solution blocking agent (C$_4$H$_9$ means t-C$_4$H$_9$) | PEB Condition | D$_o$ ($\mu$C/cm$^2$) |
| --- | --- | --- | --- |
| 12 | [Chemical structure: 2,2-bis(3,4-di(t-butoxycarbonyloxy)phenyl) derivative with H$_4$C$_4$OCO and OCOC$_4$H$_9$ groups on two phenyl rings connected by C=O, with additional OCOC$_4$H$_9$ and H$_9$C$_4$OCO substituents] | 85° C., 5 minutes | 6.4 |

EXAMPLES 13–22

The properties of electron beam resists prepared from a resist solution comprising a base resin, 2,2-bis(p-(tBoc-O-)phenyl)propane and the acid-producing agent (compound 1 ) when the proportions of each component were varied, were studied. Table 4 shows the results. Basically, PEB was performed at 85° C. for 3 minutes, and developing was performed in 2.4% aqueous TMAH for 1 minute.

TABLE 4

| Examples | Base resin | solution blocking agent | acid producing agent | D$_o$ ($\mu$C/cm$^2$) |
| --- | --- | --- | --- | --- |
| 13 | 55 wt % | 40 wt % | 5 wt % | 8 |
| 14 | 70 | 25 | 5 | 8 |
| 15 | 78 | 17 | 5 | 6 |
| 16 | 88 | 7 | 5 | 15 |
| 17 | 85.5 | 14 | 0.5 | 20 |
| 18 | 84 | 14 | 2 | 7 |
| 19 | 78 | 14 | 8 | 6 |
| 20 | 75 | 14 | 11 | 9 |
| 21 | 71 | 14 | 15 | 11 |
| 22 | 91 | 7 | 2 | 19 |

As the acid-producing agent itself has solution blocking properties, there was not much variation in sensitivity in Examples 13 to 16. However, the amount of film remaining on the unexposed part of the resist was greater for higher concentrations of solution blocking agent. In Example 13, effectively 100% of the film remained, as compared to only 87% in Example 16. In Example 17, the concentration of acid-producing agent was only 0.5%, so only about 30% of the film remained in the unexposed part of the resist. In Example 19, the amount of film remaining was 95% or more, and in Examples 20 and 21 it was effectively 100%. As the concentration of acid-producing agent increased, the contrast ($\tau$) increased. In Examples 20 and 21, the contrast was effectively the same and the value of $\tau$ was 6 or higher. In Example 22 wherein a sufficient solution blocking effect was not obtained, and which was developed in a 2.0% aqueous solution, about 20% of the film remained on the unexposed part, but if the high molecular weight solution blocking agent of Examples 3 and 4 was used, 85% or more of the film remained even for the same component proportion.

EXAMPLES 23–32

A resist solution was prepared comprising polyhydroxystyrene substituted to the extent of 40 mol % by tBoc-O- as base resin, 2,2-bis[p-(tBoc-O-)phenyl]propane and an acid-producing agent (Compound 1), and the properties of electron beam resists prepared from this solution when the proportions of each component were varied, were studied as in Examples 13 to 22. Table 5 shows the results. Basically, PEB was performed at 85° C. for 3 minutes, and developing was performed in 2.4% aqueous TMAH for 1 minute.

TABLE 5

| Example | Base resin | solution blocking agent | acid producing agent (compound 1) | D$_0$ ($\mu$C/cm$^2$) |
| --- | --- | --- | --- | --- |
| 23 | 55 wt % | 40 wt % | 5 wt % | 13 |
| 24 | 70 | 25 | 5 | 14 |
| 25 | 78 | 17 | 5 | 10 |
| 26 | 88 | 7 | 5 | 18 |
| 27 | 85.5 | 14 | 0.5 | 23 |
| 28 | 84 | 14 | 2 | 10 |
| 29 | 78 | 14 | 8 | 9 |
| 30 | 75 | 14 | 11 | 12 |
| 31 | 71 | 14 | 15 | 14 |
| 32 | 91 | 7 | 2 | 24 |

As the degree of substitution of the base resin by tBoc-O- is 40 mol %, the solution blocking effect was greater, and the solubility of the resist in aqueous alkali decreased. It can thus be seen that the sensitivity is lower compared to that of Table 4. However, a 0.2 $\mu$m line and space revolution could still be achieved, and the shape of the upper part of the pattern was closer to rectangular compared to the case where tBoc-O- substitution was 20 mol %.

The base resin used here had a dissolution rate of 15 nm/s in the developing solution. Practically no film thinning was observed even in the unexposed part of the resist in Example 32, which had only a small amount of solution blocking agent.

EXAMPLES 33 and 34

A resist solution comprising the following components:

| | |
| --- | --- |
| Base resin: | 81 parts by weight |
| 2,2-bis[p-(tBoc-O-)phenyl]propane: | 14 parts by weight |
| Acid-producing agent (Compound 1): | 5 parts by weight |
| Ethoxyethyl acetate: | 400 parts by weight | was spin-coated onto a silicon substrate at 2000 rpm, and prebaked on a hot plate at 85° C. for 1 hour. The degree of substitution of the base resin by tBoc-O- was 20% (Example 33) and 40% (Example 34).

The resist properties were evaluated using the same method as that of Example 1, and the electron beam sensitivity was found to be 8 $\mu$C/cm$^2$ in both Example 33 and Example 34. The sensitivity to KrF exima laser light was 25 mJ/cm$^2$ in both cases. From this result, it was confirmed that the sensitivity of the polymer of Synthesis Example 2 is lower than that of the polymer obtained in Synthesis Example 1.

In the case of exposure to KrF exima laser light, a 0.3 $\mu$m line and space pattern or hole pattern could be resolved, and the pattern formed had vertical walls, in both Example 32 and Example 33. Further, with electron beam patterning, a resolution of 0.2 μm was achieved. No difference of resolution was observed between the polymer of Synthesis Example 1 and the polymer of Synthesis Example 2.

What is claimed is:

1. A positive resist material for high energy-sensitive positive resists which can be developed in aqueous alkali solution, said material comprising (A) a polyhydroxystyrene resin having a molecular weight distribution in the range of $1.00 < Mw/Mn \leq 1.50$, wherein some hydroxyl groups are substituted by t-butoxycarbonyloxy groups, (b) a solution blocking agent, and (C) an onium salt, and being characterized in that said solution blocking agent contains at least one t-butoxycarbonyloxy group per molecule, said onium salt is bis(p-t-butylphenyl) iodonium trifluoromethylsulfonate represented by the following formula (1):

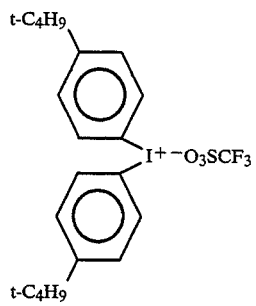

and the weight proportions of (A), (B), (C) are given by the relations $0.07 \leq B \leq 0.40$, $0.005 \leq C \leq 0.15$, $0.55 \leq A$, $A+B+C=1$.

2. The positive resist material as claimed in claim 1, wherein a molecular weight of the polyhydroxystyrene (A) is more than 10,000.

3. The positive resist material as claimed in claim 1, wherein the degree of substitution in polyhydroxystyrene by t-butoxycarbonyloxy group lies in the range 10–50 mole %.

4. The positive resist material as claimed in claim 1, wherein the solution blocking agent is at least one compound selected from a group consisting of t-butoxycarbonyloxy substituted Phloroglucinol tetrahydroxybenzophenone and bisphenol A.

5. The positive resist material as claimed in claim 1, wherein the polyhydroxystyrene is a polymer obtained by a living polymerization process.

* * * * *